(12) United States Patent
Takabe et al.

(10) Patent No.: US 9,682,560 B2
(45) Date of Patent: Jun. 20, 2017

(54) METHODS OF MANUFACTURING PIEZOELECTRIC ELEMENT, LIQUID EJECTING HEAD, AND ULTRASONIC TRANSDUCER

(71) Applicant: SEIKO EPSON CORPORATION, Tokyo (JP)

(72) Inventors: Motoki Takabe, Shiojiri (JP); Takahiro Kamijo, Matsumoto (JP); Tatsuro Torimoto, Matsumoto (JP); Toshihiro Shimizu, Fujimi-machi (JP); Shiro Yazaki, Chino (JP)

(73) Assignee: Seiko Epson Corporation, Tokyo (JP)

( * ) Notice: Subject to any disclaimer, the term of this patent is extended or adjusted under 35 U.S.C. 154(b) by 483 days.

(21) Appl. No.: 14/462,968

(22) Filed: Aug. 19, 2014

(65) Prior Publication Data
US 2015/0052715 A1    Feb. 26, 2015

(30) Foreign Application Priority Data

Aug. 20, 2013  (JP) ................... 2013-170801

(51) Int. Cl.
| | | |
|---|---|---|
| *H01L 41/22* | (2013.01) | |
| *H04R 17/00* | (2006.01) | |
| *B41J 2/16* | (2006.01) | |
| *H01L 41/08* | (2006.01) | |
| *H01L 41/09* | (2006.01) | |
| *H01L 41/332* | (2013.01) | |

(52) U.S. Cl.
CPC ............. *B41J 2/161* (2013.01); *B41J 2/1623* (2013.01); *B41J 2/1628* (2013.01); *H01L 41/0805* (2013.01); *H01L 41/0973* (2013.01); *H01L 41/332* (2013.01); *Y10T 29/42* (2015.01)

(58) Field of Classification Search
CPC ........ B41J 2/161; B41J 2/1623; B41J 2/1628; H01L 41/0973; H01L 41/332; H01L 41/0805; Y10T 29/42; Y10T 29/49002; Y10T 29/49155
USPC ............. 29/25.35, 846; 257/534; 438/3, 712
See application file for complete search history.

(56) References Cited

U.S. PATENT DOCUMENTS

| | | | | |
|---|---|---|---|---|
| 5,612,560 A | * | 3/1997 | Chivukula | .............. H01L 28/60 257/534 |
| 6,872,669 B1 | * | 3/2005 | Summerfelt | ........ H01L 21/3145 438/3 |
| 7,140,084 B2 | * | 11/2006 | Yamada | ................ B06B 1/0644 29/25.35 |

FOREIGN PATENT DOCUMENTS

JP      2011-171335      1/2011

\* cited by examiner

*Primary Examiner* — Donghai D Nguyen
(74) *Attorney, Agent, or Firm* — Workman Nydegger (57) ABSTRACT

A method of manufacturing a piezoelectric element includes a first electrode, a piezoelectric layer, and a second electrode, in which unevenness on one surface of the piezoelectric layer is formed by forming an oxidizable metal layer on the one surface of the piezoelectric layer; aggregating the metal layer by thermal oxidation; and performing isotropic etching on the metal layer aggregated on the one surface of the piezoelectric layer.

6 Claims, 6 Drawing Sheets

METHODS OF MANUFACTURING PIEZOELECTRIC ELEMENT, LIQUID EJECTING HEAD, AND ULTRASONIC TRANSDUCER

BACKGROUND

1. Technical Field

The present invention relates to a method of manufacturing a piezoelectric element (including a first electrode, a piezoelectric layer, and a second electrode), a method of manufacturing a liquid ejecting head, and a method of manufacturing an ultrasonic transducer.

2. Related Art

A known liquid ejecting head ejects liquid drops from nozzle openings communicating with pressure generating chambers by deforming a piezoelectric element (piezoelectric actuator) thereby causing pressure fluctuation in the liquid in the pressure generating chambers. A representative example of the liquid ejecting head is an ink jet recording head that ejects ink drops as liquid drops.

The ink jet recording head, for example, includes a piezoelectric element on one surface of the channel forming substrate provided with the pressure generating chamber communicating with the nozzle opening. The ink jet recording head causes the pressure change in the liquid in the pressure generating chamber by deforming the diaphragm by driving the piezoelectric element so that the ink drops are ejected from the nozzle opening.

A method of forming unevenness on the surface of the piezoelectric layer used in the ink jet recording head or the like (which is performed, for example, by wet etching) is suggested (for example, see JP-A-2011-171335).

However, there is a problem in that the etchant damages the piezoelectric layer when wet etching is performed to form unevenness on the surface of the piezoelectric layer.

In addition, the problem occurs not only in the piezoelectric element used in a liquid ejecting head or an ultrasonic transducer but also in the piezoelectric element used in other devices.

SUMMARY

An advantage of some aspects of the invention is to provide a method of manufacturing a piezoelectric element that can form unevenness on the surface of a piezoelectric layer with reduce damage thereto, a method of manufacturing a liquid ejecting head, and a method of manufacturing an ultrasonic transducer.

According to an aspect of the invention, there is provided a method of manufacturing a piezoelectric element including a first electrode, a piezoelectric layer, and a second electrode. The method includes forming an oxidizable metal layer on one surface of the piezoelectric layer; aggregating the metal layer by thermal oxidation; and performing isotropic etching on the metal layer aggregated on the one surface of the piezoelectric layer so as to form unevenness on the one surface of the piezoelectric layer.

According to the aspect, it is possible to reduce the damage to the piezoelectric layer caused by the etchant compared to a case of performing wet etching, by forming unevenness on the piezoelectric layer by isotropic dry etching. Further, it is possible to easily form the pinpoint unevenness in a predetermined region compared to the case of performing wet etching.

Here, the second electrode is preferably formed on the one surface of the piezoelectric layer, and the metal layer is preferably at least a portion of the second electrode. According to this, since the metal layer can be configured in a portion of the second electrode, the manufacturing process can be simplified.

Furthermore, according to another aspect of the invention, there is provided a method of manufacturing a liquid ejecting head including the method of manufacturing a piezoelectric element according to the aforementioned aspect.

According to this another aspect, it is possible to reduce the damage to the piezoelectric layer caused by the etchant compared to a case of performing wet etching, by forming unevenness on the piezoelectric layer by isotropic dry etching. Further, it is possible to easily form the pinpoint unevenness in a predetermined region compared to the case of performing wet etching.

Further, according to still another aspect, there is provided a method of manufacturing an ultrasonic transducer including the method of manufacturing the piezoelectric element according to the aforementioned aspect.

According to still another aspect, it is possible to reduce the damage to a piezoelectric layer caused by the etchant compared to a case of performing wet etching, by forming unevenness on the piezoelectric layer by isotropic dry etching. Further, it is possible to easily form the pinpoint unevenness in a predetermined region compared to the case of performing wet etching.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the invention is described in detail based on embodiments.

Embodiment 1

Figure 1:
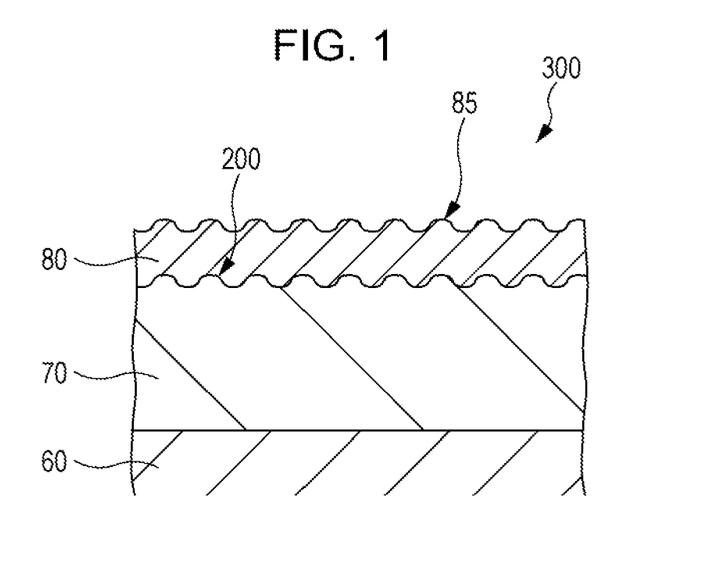
FIG. 1 is a cross-sectional view illustrating a piezoelectric element according to Embodiment 1 of the invention.

FIG. 1 is a cross-sectional view illustrating a piezoelectric element according to Embodiment 1 of the invention.

As illustrated in FIG. 1, a piezoelectric element 300 includes a first electrode 60, a piezoelectric layer 70, and a second electrode 80. According to the embodiment, although the embodiment is described with the first electrode 60 being provided on one side of the piezoelectric layer 70 and the second electrode 80 being provided on the other side of the piezoelectric layer 70, the invention is not limited thereto. For instance, the first electrodes 60 and the second electrodes 80 may be separately provided on one surface of the piezoelectric layer 70. In addition, the first electrodes 60 and the second electrodes 80 may be formed throughout the entire surface of the piezoelectric layer 70, or a portion thereof may be removed.

Here, the piezoelectric layer 70 is made of a piezoelectric material of an oxide having a polarization structure, for example, a crystalline film (perovskite crystal) having a perovskite structure represented by general formula of $ABO_3$, where A may include lead and B may include any one of zirconium and titanium. For example, B may further include niobium. Specifically, for example, lead zirconate titanate ($Pb(Zr,Ti)O_3$:PZT) and lead niobate titanate zirconate ($Pb(Zr,Ti,Nb)O_3$:PZTNS) including silicon may be used as the piezoelectric layer 70.

Further, a non-lead based piezoelectric material (for example, a complex oxide having a perovskite crystal which includes bismuth ferrate or bismuth ferrate manganate, and barium titanate or bismuth potassium titanate) may be used in the piezoelectric layer 70.

A plurality of convex portions 200 protruding on the side opposite the first electrodes 60 are provided on the one surface of the aforementioned piezoelectric layer 70, which is the second electrodes 80 side according to the embodiment. That is, unevenness is formed by the plurality of convex portions 200 on one surface of the piezoelectric layer 70. In addition, the second electrodes 80 according to the embodiment are formed by following the formation of the surface of the piezoelectric layer 70 on which the convex portions 200 are formed. Accordingly, unevenness is formed on the surface opposite to the surface of the second electrode 80 (the piezoelectric layer 70).

Here, a method of manufacturing the piezoelectric element 300 described above is described with reference to FIGS. 2A to 2C. In addition, FIGS. 2A to 2C are cross-sectional views illustrating a method of manufacturing the piezoelectric element according to the embodiment.

Figure 2A:
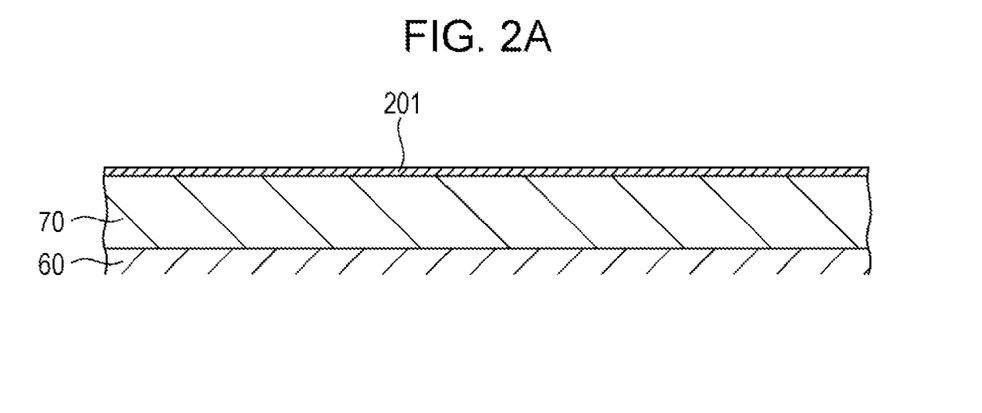
FIGS. 2A to 2C are cross-sectional views illustrating a method of manufacturing the piezoelectric element according to Embodiment 1 of the invention.

As illustrated in FIG. 2A, a metal layer 201 is formed on one surface of the piezoelectric layer 70. For the metal layer 201, the material is not limited as long as the material is a metal material that is thermally oxidizable. For example, a material including at least one kind of material selected from titanium and zirconium may be used. Further, it is appropriate that the metal layer 201 include iridium. This is because, for example, the metal layer 201 including iridium functions as a diffusion preventing layer for suppressing the components configuring the piezoelectric layer 70 from excessively diffusing into the metal layer 201 and the components of the metal layer 201 from diffusing into the piezoelectric layer 70 when the piezoelectric layer 70 and the metal layer 201 are subjected to heat treatment.

Further, a conductive material can be used in a second layer 82 configuring the second electrode 80. For example, iridium or a stacked material of iridium and titanium can be used. In addition, the second layer 82 is formed to be thicker than a first layer 81 in order to decrease the electric resistance. Additionally, internal stress of iridium is compressive stress, and internal stress of titanium is approximately 0. Therefore, internal stress of the second electrode 80 is compressive stress.

Figure 2B:
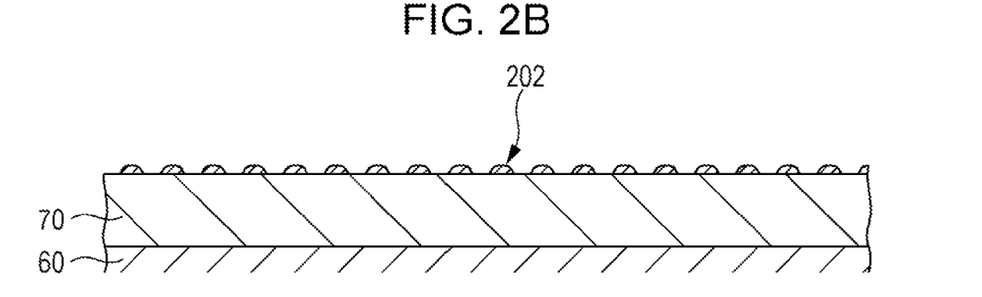
Figure 2C:
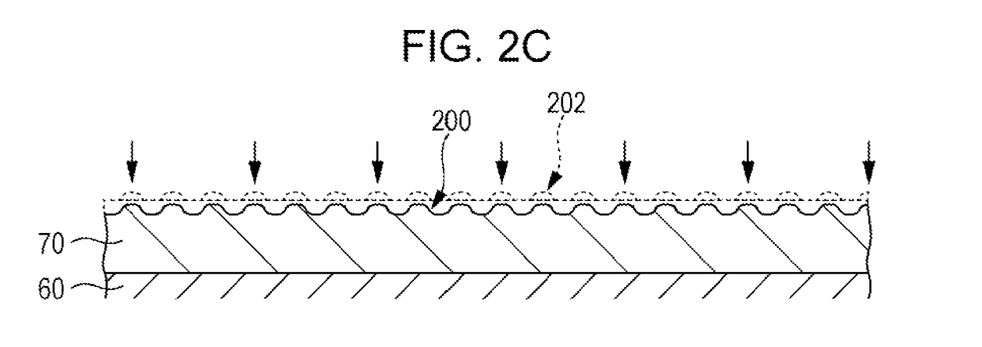

Next, as illustrated in FIG. 2B, the metal layer 201 is subjected to thermal oxidation. In this manner, the metal layer 201 is aggregated by the thermal oxidation so that a plurality of convex portions 202 are formed of oxidized metal on the surface of the piezoelectric layer 70.

According to the embodiment, the plurality of convex portions 202 are discontinuously formed on the surface of the piezoelectric layer 70 by performing thermal treatment on the metal layer 201 and aggregating the metal layer 201 by thermal oxidation. In addition, the convex portions 202 are not limited to the above, and the plurality of convex portions 202 may be continuously formed on the surface of the piezoelectric layer 70. That is, the metal layer 201 is formed on the surface of the piezoelectric layer 70 and a portion or the entire of the metal layer 201 is oxidized by heat treatment so that the plurality of convex portions 202 are formed on the surface of the metal layer 201 (the surface on the opposite side to the piezoelectric layer 70). Moreover, whether the plurality of convex portions 202 are formed on the surface of the piezoelectric layer 70 continuously or discontinuously can be changed by appropriately setting a material or a thickness of the metal layer 201, a temperature of the heat treatment, time of the heat treatment, and the like.

Moreover, the size of the convex portions 202 (specifically, the convex portions 200 described below) is changed by the conditions such as heating temperature and heating time, when the metal layer 201 is subjected to the thermal oxidation. There is a tendency in which the higher the heating temperature, the larger the convex portions 202.

Next, as illustrated in FIG. 2C, isotropic dry etching (that is, etching in which etchant is not used) is performed on the surface subjected to thermal oxidation on which the plurality of convex portions 202 are formed so that the plurality of convex portions 200 are formed on the surface of the piezoelectric layer 70. That is, the plurality of convex portions 200 can be formed by cutting down the plurality of convex portions 202 which are formed of oxidized metal and the surface of the piezoelectric layer 70 on which the convex portions 202 are not formed in the same manner, and transferring the formation approximately the same as the surface formed by the plurality of convex portions 202 and the piezoelectric layer 70 on which the convex portions 202 are not formed to the surface of the piezoelectric layer 70.

In this manner, when the plurality of convex portions 200 are formed on the surface of the piezoelectric layer 70, damage to the piezoelectric layer 70 is reduced by using the isotropic dry etching so as to suppress change of the piezoelectric characteristics of the piezoelectric layer 70. Moreover, if wet etching is performed on the piezoelectric layer 70 in order to form the plurality of convex portions 200 on the surface of the piezoelectric layer 70, damage (composition change or injection of foreign matter) to the piezoelectric layer 70 may be caused by the etchant so that the piezoelectric characteristics of the piezoelectric layer 70 are changed. Further, it is difficult to perform the pinpoint wet etching, but the pinpoint convex portions 200 can be easily formed at a specific location of the piezoelectric layer 70 by performing the isotropic dry etching as described in the embodiment.

In addition, in the isotropic dry etching, a portion of the metal layer 201 may be left on the piezoelectric layer 70, or the metal layer 201 may be completely removed.

Additionally, the piezoelectric element 300 is formed as illustrated in FIG. 1 by forming the second electrode 80 on the surface of the piezoelectric layer 70 on which the plurality of convex portions 200 are formed. That is, the second electrode 80 with a uniform thickness is formed along the surface of the piezoelectric layer 70 on which the convex portions 200 are formed so that a plurality of convex portions 85 are formed on the second electrode 80. Surely, depending on a forming method or a formed thickness of the second electrode 80, the surface of the second electrode 80 may be formed as a flat surface without forming the convex portions 85.

In this manner, the adhesion between the piezoelectric layer 70 and the second electrode 80 can be enhanced due to an anchor effect by the plurality of convex portions 200 provided on the surface of the piezoelectric layer 70. Further, when the second electrode 80 is not formed, adhesion with the wiring formed on the piezoelectric layer 70 or another member bonded by a bonding agent can be enhanced.

In addition, according to the embodiment, the metal layer 201 and the second electrode 80 are separately provided, but the invention is not limited thereto. For example, a portion of the second electrode 80 may be used as the metal layer 201. That is, the second electrode 80 may be formed with a plurality of layers, and a layer on the piezoelectric layer 70 side of the second electrode 80 may be used as the metal layer 201. In this case, at least a portion of the metal layer 201 (including a portion of the aggregated convex portions 202) may be left on the surface of the piezoelectric layer 70.

Furthermore, the heat treatment (in which the metal layer 201 is thermally oxidized) may be performed at a temperature higher than the temperature at which the metal included in the metal layer 201 which is titanium according to the embodiment is thermally oxidized. However, for example, the metal layer 201 is thermally oxidized and at the same time post-annealing (re-heat treatment) may be performed on the piezoelectric layer 70. That is, the heat treatment that causes the metal layer 201 to be thermally oxidized and the post-annealing of the piezoelectric layer 70 may be performed at the same time. In this manner, the post-annealing of the piezoelectric layer 70 is performed so that even if damage is caused when the metal layer 201 is formed on the second electrode 80 side of the piezoelectric layer 70, the damage to the piezoelectric layer 70 is repaired by performing post-annealing, and the piezoelectric characteristics of the piezoelectric layer 70 are enhanced. Surely, the heat treatment that causes the metal layer 201 to be thermally oxidized and the post-annealing of the piezoelectric layer 70 may be separately performed.

Embodiment 2

Figure 3:
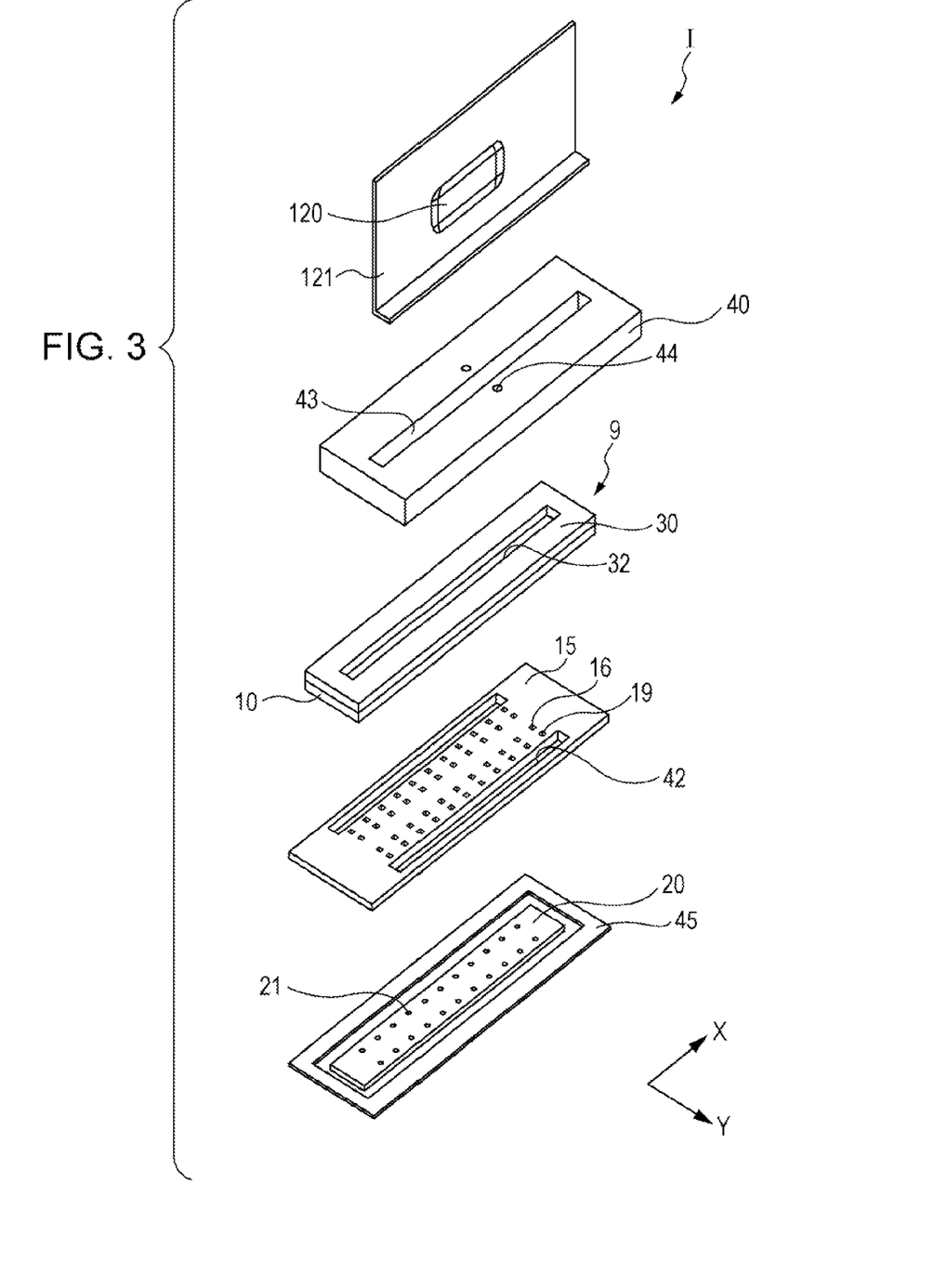
FIG. 3 is an exploded perspective view illustrating a recording head according to Embodiment 2 of the invention.
Figure 4:
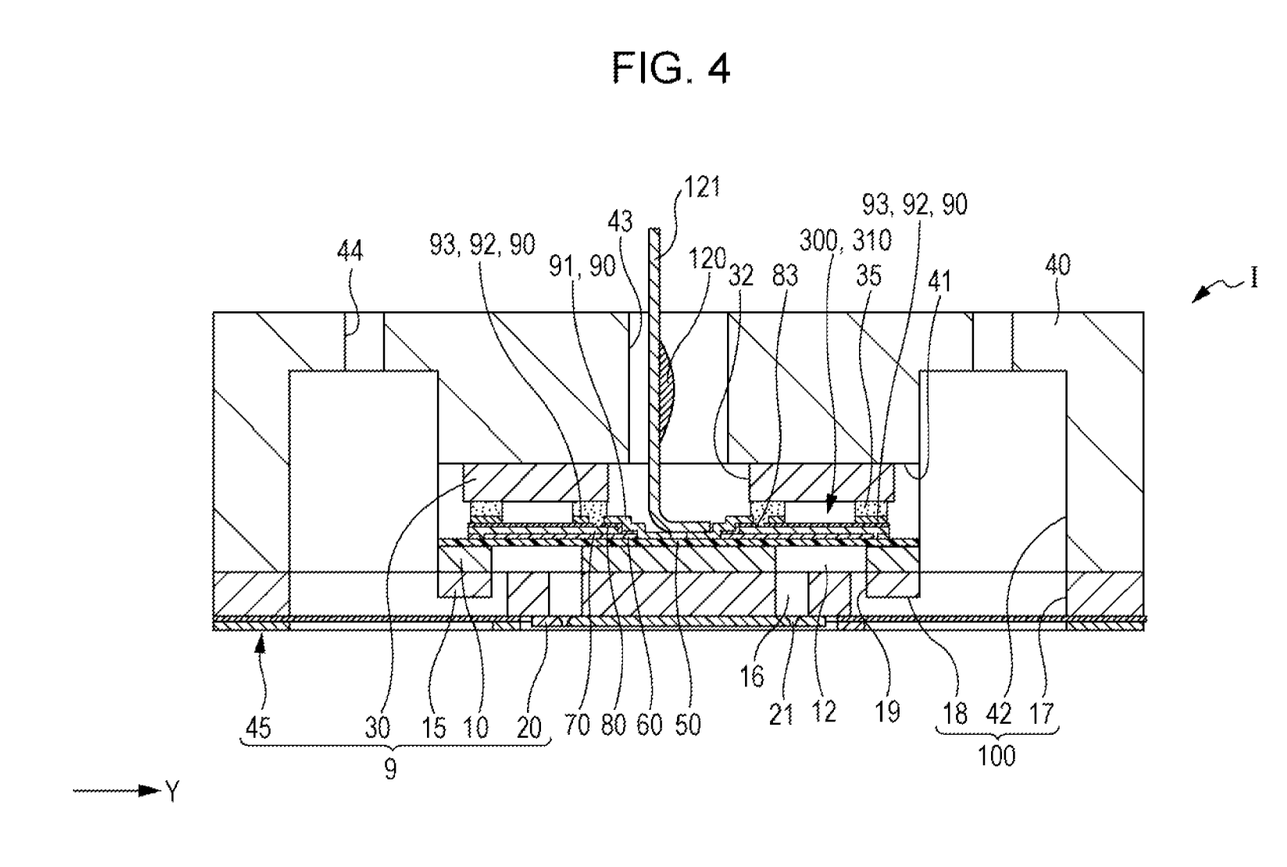
FIG. 4 is a cross-sectional view illustrating the recording head according to Embodiment 2 of the invention.
Figure 5:
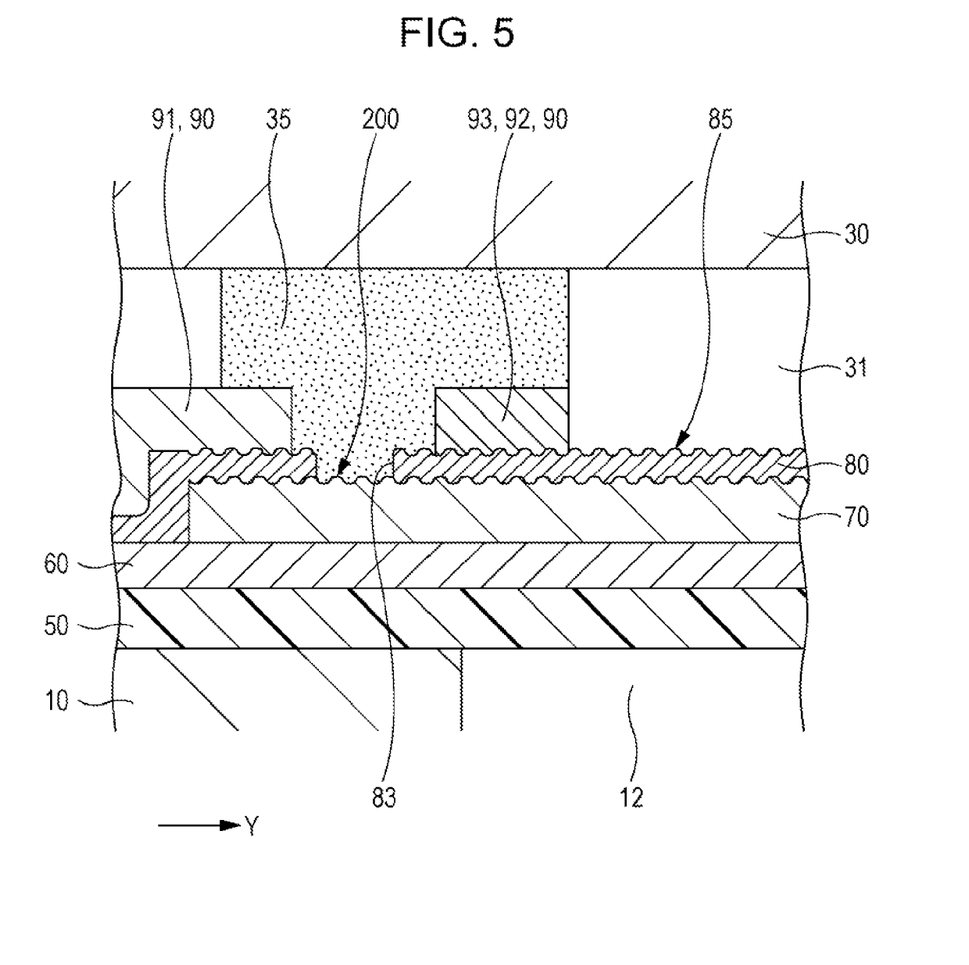
FIG. 5 is an enlarged cross-sectional view illustrating a main section of the recording head according to Embodiment 2 of the invention.

FIG. 3 is an exploded perspective view illustrating an ink jet recording head which is an example of a liquid ejecting head according to Embodiment 2 of the invention. FIG. 4 is a cross-sectional view illustrating an ink jet recording head according to Embodiment 2. FIG. 5 is an enlarged view illustrating a main section of FIG. 4.

As illustrated, an ink jet recording head I (which is an example of a liquid ejecting head according to the embodiment) includes a plurality of members such as a head main body 9 and a case member 40, and the plurality of members are joined by a bonding agent or the like. According to the embodiment, the head main body 9 includes a channel forming substrate 10, a communication substrate 15, a nozzle plate 20, a protection substrate 30, and a compliance substrate 45.

In the channel forming substrate 10 configuring the head main body 9, pressure generating chambers 12 which are separated by a plurality of partitions are arranged in parallel by performing anisotropic etching from one surface along the direction in which a plurality of nozzle openings 21 ejecting ink are arranged in parallel. Hereinafter, this direction is called the parallel arrangement direction of the pressure generating chambers 12 or a first direction X. Further, a plurality of rows in which the pressure generating chambers 12 are arranged in parallel on the channel forming substrate 10 in the first direction X (which are two rows according to the embodiment) are arranged in parallel. The parallel arrangement direction in which the plurality of rows of the pressure generating chambers 12 in which the pressure generating chambers 12 are formed along the first direction X are arranged in parallel is referred to as a second direction Y, below.

Further, a diaphragm 50 is provided on one surface of the channel forming substrate 10, and channels such as the pressure generating chambers 12 are sealed by the diaphragm 50.

Further, the communication substrate 15 is joined to the other surface (the opposite side to the diaphragm 50) of the channel forming substrate 10. Further, the nozzle plate 20 (in which the plurality of nozzle openings 21 communicating with the respective pressure generating chambers 12 are punched) is joined to the communication substrate 15.

Nozzle communication channels 16 that connect the pressure generating chambers 12 and the nozzle openings 21 are provided in the communication substrate 15. The communication substrate 15 is larger than the channel forming substrate 10 in size, and the nozzle plate 20 is smaller than the channel forming substrate 10 in size. The cost may be reduced by configuring the nozzle plate 20 to be relatively small in size.

Further, a first manifold portion 17 and a second manifold portion 18 that configure a portion of a manifold 100 are provided on the communication substrate 15.

Furthermore, common communication channels 19 that communicate with one end portions of the pressure generating chambers 12 in the second direction Y are provided to the communication substrate 15 independently for the respective pressure generating chambers 12. The common communication channels 19 cause the second manifold portion 18 and the pressure generating chambers 12 to communicate with each other.

Further, the nozzle openings 21 that communicate with the respective pressure generating chambers 12 through the nozzle communication channels 16 are formed in the nozzle plate 20. That is, rows in which the nozzle openings 21 are arranged in parallel in the first direction X are formed in the second direction Y in plural, which is two according to the embodiment.

Meanwhile, the diaphragm 50 is formed on the opposite surface to the communication substrate 15 of the channel forming substrate 10. Further, the first electrode 60, the piezoelectric layer 70, and the second electrode 80 are stacked on the diaphragm 50, and piezoelectric actuators 300 (which are piezoelectric elements according to the embodiment) are formed.

Figure 6A:
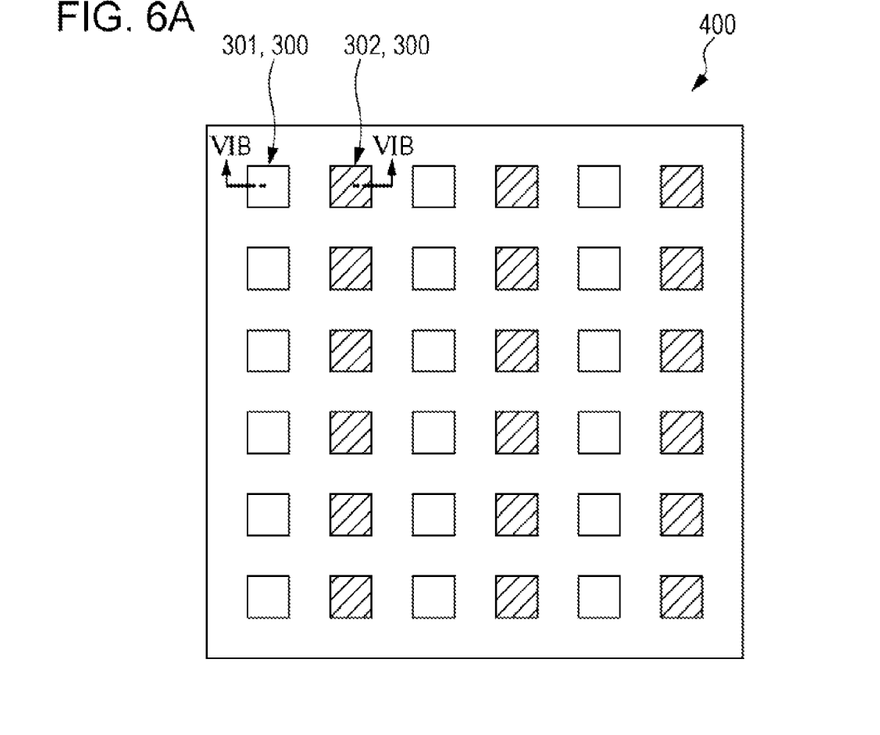
FIGS. 6A and 6B are a plan view and a cross-sectional view illustrating an ultrasonic device according to Embodiment 3 of the invention.
Figure 6B:
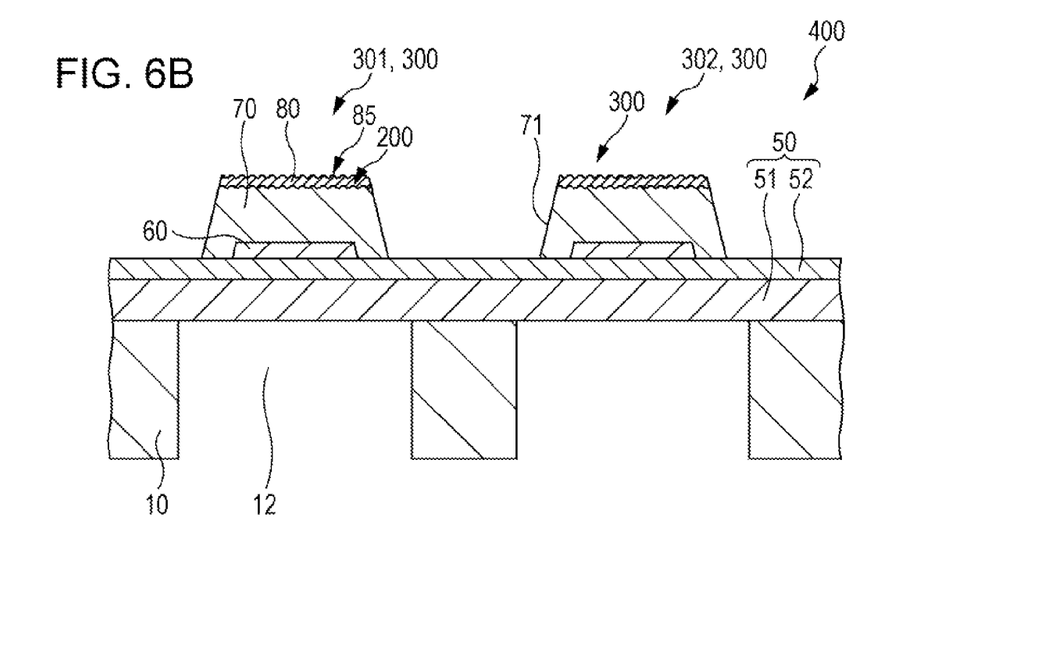

As illustrated in FIGS. 6A and 6B, the first electrodes 60 that configure the piezoelectric actuators 300 are separated for each of the pressure generating chambers 12 to configure into individual electrodes independent for each of the piezoelectric actuators 300.

The piezoelectric layer 70 is continuously provided along the first direction X in order to have a predetermined width in the second direction Y. The width of the piezoelectric layer 70 in the second direction Y is wider than the length of the pressure generating chambers 12 in the second direction Y. Therefore, the piezoelectric layer 70 is provided up to the outside of the pressure generating chambers 12 in the second direction Y of the pressure generating chamber 12.

In addition, individual lead electrode 91 formed of, for example, gold (Au) is connected to the first electrodes 60 extending up to the outside of the piezoelectric layer 70. Though not illustrated in the drawings, a wiring substrate 121 (on which a drive circuit 120 or the like is mounted) is connected to the individual lead electrode 91.

As illustrated in FIGS. 6A and 6B, the second electrodes 80 are continuously provided on the piezoelectric layer 70 in the first direction X of the pressure generating chambers 12 and configure common electrodes which are common to a plurality of active portions 310 described below. Further, a portion on the piezoelectric layer 70 of the second electrode 80 is electrically cut by a removing portion 83 (see FIG. 5). That is, the second electrodes 80 on the first electrodes 60 and the second electrodes 80 on the piezoelectric layer 70 are discontinuous so that the first electrodes 60 (individual electrode) and the second electrodes 80 (common electrode) do not cause a short circuit. Here, the removing portion 83 is installed on the nozzle openings 21 side on the piezoelectric layer 70, penetrates the second electrode 80 in the thickness direction, and electrically cuts the second electrode 80. The removing portion 83 continues along the first direction X and penetrates the second electrode 80 in the thickness direction.

Further, the plurality of convex portions 85 that protrude on the opposite side to the piezoelectric layer 70 are provided on the second electrode 80.

Further, the plurality of convex portions 200 are formed on the surface of the second electrode 80 side of the piezoelectric layer 70. That is, the plurality of convex portions 200 are formed in an area of the piezoelectric layer 70 in which the second electrode 80 is formed and an area which is exposed by the removing portion 83. The convex portions 85 of the second electrode 80 and the convex portions 200 of the piezoelectric layer 70 are the same as Embodiment 1, and can be manufactured by the manufacturing method of Embodiment 1. Therefore, repeated description will be omitted.

The piezoelectric actuators 300 configured as above generate displacement by applying voltage between the first electrodes 60 and the second electrodes 80. That is, piezoelectric strain is generated on the piezoelectric layer 70 interposed between the first electrodes 60 and the second electrodes 80 by applying the voltage between both electrodes. Additionally, when the voltage is applied between both electrodes, a portion in which the piezoelectric strain is generated on the piezoelectric layer 70 is called the active portion 310. On the other hand, a portion in which the piezoelectric strain is not generated on the piezoelectric layer 70 is called a non-active portion. Further, in the active portion 310 in which piezoelectric strain is generated on the piezoelectric layer 70, a portion that faces the pressure generating chamber 12 is called a flexible portion, and a portion outside the pressure generating chamber 12 is called a non-flexible portion.

According to the embodiment, all of the first electrode 60, the piezoelectric layer 70, and the second electrode 80 are continuously provided up to the outside of the pressure generating chamber 12 in the second direction Y of the pressure generating chamber 12. That is, the active portion 310 is continuously provided up to the outside of the pressure generating chamber 12. Therefore, a portion that faces the pressure generating chamber 12 of the piezoelectric actuator 300 among the active portions 310 becomes a flexible portion, and a portion outside the pressure generating chamber 12 becomes a non-flexible portion.

Here, according to the embodiment, as illustrated in FIG. 4, the end portion of the active portion 310 in the second direction Y is regulated by the second electrode 80, and the end portion of the active portion 310 in the second direction Y is provided outside of the portion that faces the pressure generating chamber 12 (that is, in the non-flexible portion).

Further, the end portion of the active portion 310 in the first direction X is regulated by the first electrodes 60. Additionally, the end portions of the first electrodes 60 in the first direction X are provided in the portions that face the pressure generating chambers 12. Accordingly, the end portion of the active portion 310 in the first direction X is provided on the flexible portion, and the stress on the border between the active portion 310 and the non-active portion is opened in the first direction X by the deformation of the diaphragm. Therefore, deterioration such as burns or cracks caused by the stress concentration in the end portion of the active portion 310 in the first direction X can be suppressed.

In the piezoelectric actuator 300 like this, since the second electrode 80 covers the piezoelectric layer 70, current does not leak between the first electrode 60 and the second electrode 80, and the deterioration of the piezoelectric actuator 300 can be suppressed. Moreover, if the first electrode 60 and the second electrode 80 are exposed in the state of coming close to each other, the current leaks on the surface of the piezoelectric layer 70 so that the piezoelectric layer 70 is deteriorated. Moreover, even though the first electrode 60 and the second electrode 80 are exposed, if the distance is not short, the leak of the current rarely occurs.

Lead electrodes 90 (the individual lead electrode 91 and common lead electrodes 92) which are the wiring layers in this embodiment are connected to the first electrodes 60 and the second electrodes 80 of the piezoelectric actuators 300.

Here, the individual lead electrode 91 is led from the first electrodes 60 extending up to the outside of the piezoelectric layer 70, to the diaphragm 50.

Though not illustrated, the common lead electrode 92 is led from the second electrode 80 (on the second electrode 80 on the piezoelectric layer 70) to the diaphragm 50 in the second direction Y on both end portions in the first direction X.

Further, the common lead electrodes 92 have extended portions 93 provided to be mounted on the wall surfaces on both sides of the pressure generating chamber 12 (that is, on the border portions between the flexible portion and the non-flexible portion in the second direction Y). The extended portions 93 are continuously provided along the first direction X of the plurality of active portions 310 so as to be continued to the common lead electrodes 92 on both end portions in the first direction X. That is, the common lead electrodes 92 having the extended portions 93 are continuously arranged so as to enclose the circumference of the active portions 310 when viewed from the protection substrate 30 side in a plan view. According to the embodiment, the common lead electrodes 92 and the extended portions 93 formed on the second electrodes 80 become wires. That is, providing wires on the channel forming substrate 10 includes states of providing wires directly on the channel forming substrate 10 and providing wires with another member being interposed therebetween (on the upper portion).

In this manner, the extended portions 93 are provided so that the rigidity on the border between the flexible portion and the non-flexible portion is enhanced, and the deterioration of the piezoelectric layer 70 caused by the stress concentration on the border between the flexible portion and the non-flexible portion can be suppressed. Further, since the common lead electrode 92 is substantially not provided on the flexible portion, it is possible to suppress the displacement of the active portion 310 from decreasing.

The protection substrate 30 is joined to one surface of the channel forming substrate 10 on which the piezoelectric actuators 300 are provided. The protection substrate 30 according to the embodiment is bonded on the piezoelectric actuators 300 through a bonding agent 35. Here, the protection substrate 30 is bonded on one end portion of the individual lead electrode 91 side of the piezoelectric actuator 300 in the first direction X, on the individual lead electrode 91, on the piezoelectric layer 70 exposed by the removing portion 83, and on the extended portion 93. Further, the protection substrate 30 is bonded to the extended portion 93 on the other end portion on the opposite side to the individual lead electrode 91 of the piezoelectric actuator 300 in the first direction X. Additionally, since unevenness is formed by the plurality of convex portions 200 on the surface exposed by the removing portion 83 of the piezoelectric layer 70 to which the protection substrate 30 is bonded, the bonding strength of the bonding agent 35 is enhanced due to the anchor effect. That is, the extended portions 93 are provided on the border between the flexible portion and the non-flexible portion, and the stress at the time of driving the piezoelectric actuator 300 is applied to the removing portion 83 that comes close to the border between the flexible portion and the non-flexible portion. Therefore, if the adhesion between the bonding agent 35 and the piezoelectric layer 70 exposed by the removing portion 83 is low, the bonding agent 35 is comparatively more easily separated from the piezoelectric layer 70 than the other portions. According to the embodiment, it is possible to enhance the bonding strength by the anchor effect by providing the plurality of convex portions 200 on the region which is easily separated due to the application of the stress by the driving of the piezoelectric actuator 300 (that is, on the surface exposed by the removing portion 83 of the piezoelectric layer 70). Therefore, it is possible to suppress the separation of the bonding agent 35 that bonds the protection substrate 30.

Further, through holes 32 that penetrate the protection substrate 30 in the thickness direction are provided on the protection substrate 30. The individual lead electrodes 91 connected to the first electrodes 60 of the active portions 310 and the common lead electrodes 92 connected to the second electrodes 80 are exposed in the through holes 32. Terminals (not illustrated) of the wiring substrate 121 provided with the drive circuit 120 which is not illustrated are connected to the individual lead electrode 91 and the common lead electrodes 92 exposed in the through holes 32.

Further, the case member 40 that forms the manifolds 100 communicating with the plurality of pressure generating chambers 12 together with the head main body 9 is fixed to the head main body 9 configured as above. The case member 40 has a concave portion 41 having a depth in which the channel forming substrate 10 and the protection substrate 30 are accommodated on the protection substrate 30 side. Additionally, an opening surface on the nozzle plate 20 side of the concave portion 41 is sealed with the communication substrate 15 in a state where the channel forming substrate 10 and the like are accommodated in the concave portion 41. In this manner, a third manifold portion 42 is formed by the case member 40 and the head main body 9 on a circumference of the channel forming substrate 10. Additionally, the manifold 100 according to the embodiment is configured with the first manifold portion 17 and the second manifold portion 18 provided in the communication substrate 15, and the third manifold portion 42 formed by the case member 40 and the channel forming substrate 10.

Further, the compliance substrate 45 is provided on the surface in which the first manifold portion 17 and the second manifold portion 18 of the communication substrate 15 open. The compliance substrate 45 seals the opening of the first manifold portion 17 and the second manifold portion 18.

In addition, introducing channels 44 that communicate with the manifolds 100 to supply ink to the manifolds 100 are provided in the case member 40. Further, a connection opening 43 which communicates the through holes 32 of the protection substrate 30 and through which the wiring substrate 121 is inserted is provided in the case member 40.

In the ink jet recording head I, when ink is ejected, the ink is received from an ink storing section such as a cartridge through the introducing channels 44, and the inside of the channel reaching from the manifolds 100 to the nozzle openings 21 is filled with ink. Thereafter, an elastic film 51 and an insulating film 52 are deflected together with the piezoelectric actuators 300 by applying the voltage to the respective piezoelectric actuators 300 corresponding to the pressure generating chambers 12 according to signals from the drive circuit 120. In this manner, the pressure in the pressure generating chambers 12 is increased, so that ink drops are ejected from the predetermined nozzle openings 21.

Embodiment 3

Hereinafter, an ultrasonic sensor according to an embodiment of the invention is described. In addition, the embodiment described below is not intended to limit the invention recited in the claims, and not all the configurations of the embodiment are essential for the solution of the invention. Further, the same elements in the embodiment described above are denoted by the same reference numerals, and repeated description is omitted.

According to the embodiment, transmission and reception of ultrasonic waves are performed by using an electroacoustic transducer using a piezoelectric effect. The electroacoustic transducer is a piezoelectric element and uses conversion of electrical energy into mechanical energy (inverse piezoelectric effect) at the time of generating ultrasonic waves so that the change caused by contraction and expansion of the piezoelectric layer excites and vibrates the diaphragm such that ultrasonic waves are generated. Accordingly, in this case, the piezoelectric element functions as a transmitting ultrasonic transducer.

Further, in order to receive ultrasonic waves reflected from a detection subject, conversion of mechanical energy into electrical energy (positive piezoelectric effect) is used so that electrical energy is generated by the deformation of the piezoelectric layer, and signals of the electrical energy are detected. Accordingly, in this case, the piezoelectric element functions as a signal receiving ultrasonic transducer.

In addition, according to the embodiment, the piezoelectric element (ultrasonic transducer) includes a diaphragm, a first electrode provided on the diaphragm, a piezoelectric layer provided on the first electrode, and a second electrode provided on the piezoelectric layer. In addition, the first electrode can be used as the diaphragm.

FIGS. 6A and 6B are a plan view and a cross-sectional view taken along Line VIB-VIB illustrating an ultrasonic device on which the ultrasonic transducer is mounted according to Embodiment 3 of the invention.

As illustrated in FIG. 6A, a plurality of signal transmitting ultrasonic transducers 301 and a plurality of signal receiving ultrasonic transducers 302 are provided on the substrate 10 having substrate openings 12 in an array shape so that an ultrasonic device 400 (array sensor) is formed. The energization can be switched to each row of the transducer by alternately arranging the plurality of signal transmitting ultrasonic transducers 301 and the plurality of signal receiving ultrasonic transducers 302 in each row. According to the switching of the energization, line scanning and sector scanning are realized. Further, input and output levels are determined according to the number of transducers performing energization and the number of rows of the transducers. Six rows and six columns of transducers are formed (not illustrated). The rows and columns are determined according to stretching of the scope of scanning.

In addition, the signal transmitting ultrasonic transducers 301 and the signal receiving ultrasonic transducers 302 can be alternately arranged transducer by transducer. In this case, directional angles of the transmission and the reception of signals can be easily matched by matching central axes of ultrasonic waves in the transmission side and the reception side to be transmission and reception sources of the ultrasonic waves.

Further, both of the signal transmitting ultrasonic transducers 301 and the signal receiving ultrasonic transducers 302 are arranged on a sheet of substrate 10, in order to minimize the size of the device. However, the signal transmitting ultrasonic transducers 301 and the signal receiving ultrasonic transducers 302 can be respectively arranged on an individual substrate according to the function of the ultrasonic transducer, or a plurality of sheets of substrates can be used according to the usage. Further, one ultrasonic transducer can perform both of the transmission and reception functions by using time difference of the transmission and the reception.

In FIG. 6B, as an embodiment that can be used as an ultrasonic wave converter, for example, the substrate 10 is configured with a single crystal silicon with (100), (110), or (111) orientation. Further, in addition to a silicon material, a ceramic material represented by $ZrO_2$ or $Al_2O_3$, a glass ceramic material, an oxide substrate material such as MgO and $LaAlO_3$, SiC, $SiO_2$, a polycrystalline silicon, and an inorganic material such as $Si_3N_4$ can be used. Further, a laminated material formed from the combination of the materials can be used.

The diaphragm 50 can be formed on the upper portion of the substrate 10 (on the piezoelectric layer 70 side). A portion of the substrate 10 can be caused to be thin and used as the diaphragm 50, but the piezoelectric layer 70 or the first electrode 60 also can be used. Additionally, it is possible to manufacture a film by using another material. In this case, a silicon compound such as $SiO_2$, SiC, and $Si_3N_4$, a polycrystalline silicon, a ceramic material such as $ZrO_2$ or $Al_2O_3$, and an oxide such as MgO, $LaAlO_3$, and $TiO_2$ may be used. The determination of the film thickness and the film material can be made based on the resonance frequency. In addition, it is preferable to use a material that can prevent the diffusion of the piezoelectric layer material, for example, $ZrO_2$, as the surface layer of the diaphragm 50 on the piezoelectric layer 70 side. In this case, the enhancement of the piezoelectric characteristics of the piezoelectric layer can lead to the enhancement of the transmission and reception characteristics of the transducer.

The substrate openings 12 which are apertures are formed in the substrate 10. The substrate openings 12 can be formed by using processing methods such as etching, grinding, or laser processing depending on the material of the substrate.

The configurations of the first electrodes 60, the piezoelectric layer 70, and the second electrodes 80 are the same as those in Embodiments 1 and 2. Therefore, the descriptions of the configurations are omitted. In addition, with respect to Embodiment 2, since it is required to drive the ultrasonic device in a higher frequency area than the liquid ejecting head represented by the ink jet recording head I, the physical properties of thickness and Young's modulus of each of the electrode materials of the piezoelectric layer 70 and the diaphragm 50 can be adjusted. Further, the configuration in which the plurality of convex portions 200 are formed on the second electrode 80 side of the piezoelectric layer 70, and also the plurality of convex portions 85 are formed on the opposite side to the piezoelectric layer 70 of the second electrode 80 is the same as Embodiments 1 and 2. Additionally, since the manufacturing methods of the piezoelectric elements which are the signal transmitting ultrasonic transducer 301 and the signal receiving ultrasonic transducer 302 are the same as Embodiments 1 and 2, repeated descriptions are omitted.

Furthermore, wires (not illustrated) are respectively connected to the signal transmitting ultrasonic transducers 301 and the signal receiving ultrasonic transducers 302, and each of the wires is connected to a terminal portion (not illustrated) of a control substrate (not illustrated) through a flexible print substrate (not illustrated). A control portion (not illustrated) including a calculating portion and a storing portion is provided to the control substrate. The control portion is configured to control input signals to be input to the signal receiving ultrasonic transducer 301 and also to process output signals output from the signal transmitting ultrasonic transducer 302.

In this manner, in the ultrasonic device 400 according to the invention, the piezoelectric elements 300 created by using the technique of MEMS can be arranged at a narrower pitch (higher resolution) than the sensors using bulk-type piezoelectric ceramics and the like, and also the driving voltage thereof is low. Therefore, it is effective to reduce the size, the thickness, and the consumed energy of the device and an apparatus on which the device is mounted. Further, since the manufacturing variations in the piezoelectric element 300 are small, it is effective to enhance the recognition accuracy.

Further, the displacement characteristics are enhanced by causing the film thickness of the piezoelectric layer 70 to be thin so that the effect of enhancing the efficiency of the transmission and reception of the ultrasonic waves can be obtained.

Furthermore, according to the embodiment, since the plurality of convex portions 200 are formed without using etchant on the surface of the piezoelectric layer 70, damage to the piezoelectric layer 70 by the etchant can be reduced. Therefore, it is possible to realize the ultrasonic device 400 having prominent piezoelectric characteristics. Further, when another member is bonded to the piezoelectric layer 70 on which the convex portions 200 are formed or the convex portions 85 of the second electrode 80, the bonding strength can be enhanced by the anchor effect.

Other Embodiments

In the above, the respective embodiments of the invention are described, but the basic configurations of the invention are not limited to the description.

For example, in Embodiment 2, the channel forming substrate 10 and the nozzle plate 20 are joined through the communication substrate 15, but the invention is not limited to this configuration. For example, the channel forming substrate 10 and the nozzle plate 20 may be directly joined. Further, another substrate other than the communication substrate 15 may be interposed between the nozzle plate 20 and the channel forming substrate 10.

In addition, in Embodiment 2, an ink jet recording head is described as an example of a liquid ejecting head, and an ink jet recording apparatus is described as an example of a liquid ejecting apparatus. However, the invention is widely targeted to all manufacturing methods of a liquid ejecting head, and can be certainly applied to a manufacturing method of a liquid ejecting head that ejects a liquid other than ink. As another liquid ejecting head, for example, various types of recording heads used as an image recording apparatus such as a printer, a colored material ejecting head used to manufacture a color filter such as a liquid crystal display, an electrode material ejecting head used to form an electrode such as an organic EL display and a field emission display (FED), and a bioorganic material ejecting head used to manufacture a biochip can be included.

Further, the invention is not limited to a piezoelectric element mounted on the liquid ejecting head represented by the ink jet recording head, or the piezoelectric element mounted on the ultrasonic sensor, but can be applied to the manufacturing method of a piezoelectric element mounted on another apparatus such as an ultrasonic wave motor, a pressure sensor, and a pyroelectric sensor. Further, the invention can be applied to the manufacturing method of a ferroelectric element such as a ferroelectric memory in the same manner.

The entire disclosure of Japanese Patent Application No: 2013-170801, filed Aug. 20, 2013 is expressly incorporated by reference herein in its entirety.

What is claimed is:

1. A method of manufacturing a piezoelectric element including a first electrode, a piezoelectric layer, and a second electrode, comprising:
    forming an oxidizable metal layer on one surface of the piezoelectric layer;
    aggregating the metal layer by thermal oxidation; and
    performing isotropic dry etching on the metal layer aggregated on the one surface of the piezoelectric layer so as to form unevenness on the one surface of the piezoelectric layer.

2. The method of manufacturing a piezoelectric element according to claim 1,
    wherein the second electrode is formed on one surface of the piezoelectric layer, and
    wherein the metal layer is at least a portion of the second electrode.

3. A method of manufacturing a liquid ejecting head comprising a method of manufacturing a piezoelectric element including a first electrode, a piezoelectric layer, and a second electrode, the method of manufacturing the piezoelectric element comprising:
    forming an oxidizable metal layer on one surface of the piezoelectric layer;
    aggregating the metal layer by thermal oxidation;
    performing isotropic dry etching on the metal layer aggregated on the one surface of the piezoelectric layer so as to form unevenness on the one surface of the piezoelectric layer; and providing the manufactured piezoelectric element into the liquid ejecting head.

4. The method of manufacturing a liquid ejecting is accordance with claim 3,
    wherein the second electrode is formed on one surface of the piezoelectric layer, and
    wherein the metal layer is at least a portion of the second electrode.

5. A method of manufacturing an ultrasonic transducer comprising a method of manufacturing a piezoelectric element including a first electrode, a piezoelectric layer, and a second electrode, the method of manufacturing the piezoelectric element comprising:
    forming an oxidizable metal layer on one surface of the piezoelectric layer;
    aggregating the metal layer by thermal oxidation;
    performing isotropic dry etching on the metal layer aggregated on the one surface of the piezoelectric layer so as to form unevenness on the one surface of the piezoelectric layer; and providing the manufactured piezoelectric element into the ultrasonic transducer.

6. The method of manufacturing an ultrasonic transducer according to claim 5,
    wherein the second electrode is formed on one surface of the piezoelectric layer, and
    wherein the metal layer is at least a portion of the second electrode.

* * * * *